US005770103A

United States Patent [19]
Wang et al.

[11] Patent Number: 5,770,103
[45] Date of Patent: Jun. 23, 1998

[54] COMPOSITION AND METHOD FOR POLISHING A COMPOSITE COMPRISING TITANIUM

[75] Inventors: Huey-Ming Wang, Hockessin; Guangwei Wu, Wilmington, both of Del.; Lee Melbourne Cook, Steelville, Pa.

[73] Assignee: Rodel, Inc., Newark, Del.

[21] Appl. No.: 889,338

[22] Filed: Jul. 8, 1997

[51] Int. Cl.[6] ............................ C09K 13/00; C09K 13/02
[52] U.S. Cl. ........................ 252/79.1; 252/79.5; 51/309; 438/692
[58] Field of Search ................ 51/306, 309; 451/36, 451/37; 438/692

[56] References Cited

U.S. PATENT DOCUMENTS

| 4,954,142 | 9/1990 | Carr et al. | 51/309 |
| 4,959,113 | 9/1990 | Roberts | 156/636 |
| 5,244,534 | 9/1993 | Yu et al. | 156/636 |
| 5,382,272 | 1/1995 | Cook et al. | 51/293 |
| 5,391,258 | 2/1995 | Brancaleoni et al. | 156/636 |
| 5,476,606 | 12/1995 | Brancaleoni et al. | 252/79.1 |

OTHER PUBLICATIONS

Rutten et al., "Pattern Density Effects in Tungsten CMP", Jun. 27–29, 1995 VMIC Conference ISMIC–104/95/0491.

*Primary Examiner*—Deborah Jones
*Attorney, Agent, or Firm*—Kenneth A. Benson

[57] ABSTRACT

Aqueous slurries are provided, which are useful for the chemical-mechanical polishing of substrates comprising titanium, comprising: water, submicron abrasive particles, an oxidizing agent, and a mono-, di-, or tri-substituted phenol wherein at least one of the substituted functional groups is polar. Optionally the compositions may also comprise a compound to suppress the rate of removal of silica. The slurries are useful on substrates which also comprise tungsten, aluminum or copper.

17 Claims, No Drawings

COMPOSITION AND METHOD FOR POLISHING A COMPOSITE COMPRISING TITANIUM

BACKGROUND OF THE INVENTION

1. Field of the Invention

The present invention relates to compositions which are useful as slurries used during the chemical-mechanical polishing of substrates, especially those comprised of silica, a metal, titanium and/or titanium nitride.

2. Description of Related Art

Conventional polishing compositions or slurries generally consist of a solution which contains abrasive particles. The part, or substrate, is bathed or rinsed in the slurry while an elastomeric pad is pressed against the substrate and the pad and substrate are moved relative to each other. Thus the abrasive particles are pressed against the substrate under load and the lateral motion of the pad causes the abrasive particles to move across the substrate surface, resulting in wear and volumetric removal of the substrate surface.

In many cases the rate of surface removal is determined solely by the degree of applied pressure, the velocity of pad rotation and the chemical activity of the slurry particle. Enhancement of the chemical activity of the polishing particle has been the basis of numerous patents, for example U.S. Pat. No. 4,959,113 (Roberts) and U.S. Pat. No. 5,382,272 (Cook et al.) both assigned to Rodel, Inc., Newark, Del.

An alternative means of increasing polishing rates is to add components to the slurries which by themselves are corrosive to the substrate and/or the oxide of the substrate. When used together with abrasive particles, substantially higher polishing rates may be achieved. This process, often termed chemicalmechanical polishing (CMP) is a preferred technique for polishing of semiconductors and semiconductor devices, particularly integrated circuits. Often additives are introduced to the slurries which accelerate the dissolution of the metal component and/or the oxide of the metal component in the polishing of dielectric/metal composite structures such as interconnect vias in integrated circuit structures. The purpose of this and other related techniques is to preferentially remove the metal portion of the circuit so that the resulting surface becomes coplanar with an insulating or dielectric feature, typically composed of $SiO_2$. This process is termed planarization.

Often titanium/titanium nitride films are used to promote adhesion of tungsten and aluminum to silicon oxide insulating layers. Rutten et al. ("Pattern Density Effects in Tungsten CMP", Jun. 27–29, 1995 VMIC Conference, ISMIC-104/95/0491) discusses the problems encountered when planarizing a structure in which tungsten, titanium and titanium nitride are used. Ideally, the titanium/titanium nitride layer should be removed at a rate comparable to the rate for tungsten removal, however, titanium is a very non-corrosive material. It does not oxidize easily and, therefore, is difficult to remove.

The objective of the present invention is to find slurry compositions which are particularly effective on a composite comprising silica, a metal, and titanium in some form.

SUMMARY OF THE INVENTION

An aqueous slurry is provided which is useful for the chemical-mechanical polishing of substrates containing titanium comprising: water, submicron abrasive particles, an oxidizing agent, and a compound which is a mono-, di-, or tri-substituted phenol wherein at least one of the substituted functional groups is polar. Examples of such functional groups are hydroxyl, nitro, amine, carboxyl, sulfo and phospho groups.

A method of chemical-mechanical polishing of substrates containing titanium with a polishing slurry comprising: water, submicron abrasive particles, an oxidizing agent, and a compound which is a mono-, di-, or tri-substituted phenol wherein at least one of the substituted functional groups is polar. Examples of such functional groups are hydroxyl, nitro, amine, carboxyl, sulfo and phospho groups.

DESCRIPTION OF THE PREFERRED EMBODIMENTS

It has been found that the addition of a mono-, di-, or tri-substituted phenol compound, wherein at least one of the substituted functional groups is jpolar, to polishing slurries used in the chemical-mechanical polishing of composites comprised of a metal, and titanium can provide a high rate of removal of titanium and other metals in the composites. The other metal commonly found in such composites is tungsten, aluminum, or copper. The present invention can be applied to composites containing any of these metals.

The submicron abrasive particles in the compositions of the present invention may be comprised of any of the oxides used for chemical-mechanical polishing such as alumina, silica, ceria, and zirconia. Abrasive particles can be used in slurries for CMP at about 0.01% to about 15% by weight. Generally they are used at concentrations of about 1% to about 10% by weight. Alumina is a preferred abrasive particle. Most preferred is alumina at about 5% to about 7% by weight.

The oxidizing agent in the compositions of the present invention may be comprised of any of the common oxidizing agents such as nitrates, iodates, chlorates, perchlorates, chlorites, sulphates, persulphates, peroxides, ozonated water, and oxygenated water. Oxidizing agents can be used in slurries for CMP at concentrations of about 0.01% to about 7% by weight. Generally they are used at concentrations of about 1% to about 7% by weight. An iodate is a preferred oxidizing agent. Most preferred is potassium iodate at about 2% to about 4% by weight.

Compositions of this invention may optionally further comprise compounds which act as complexing agents or chelating agents for $SiO_2$ These are described in great detail in U. S. Pat. No. 5,391,258 and U. S. Pat. No. 5,476,606. These compounds must have at least two acid groups present in the structure which can affect complexation to the silica. Acid species are defined as those functional groups having a dissociable proton. These include, but are not limited to, carboxyl, hydroxyl, sulfo and phospho groups. Carboxyl and hydroxyl groups are preferred as these are present in the widest variety of effective species. Particularly effective are structures which possess two or more carboxyl groups with hydroxyl groups in an alpha position, such as straight chain mono- and di-carboxylic acids and salts including, for example, malic acid and malates, tartaric acid and tartarates and gluconic acid and gluconates. Also effective are tri- and polycarboxylic acids and salts with secondary or tertiary hydroxyl groups in an alpha position relative to a carboxyl group such as citric acid and citrates. Also effective are compounds containing a benzene ring such as ortho di- and polyhydroxybenzoic acids and acid salts, phthalic acid and acid salts, pyrocatecol, pyrogallol, gallic acid and gallates and tannic acid and tannates. These complexing agents may be used in slurries for CMP at about 0.1% to about 7% by weight. Preferably they are used at about 2% to about 4% by weight.

The mono-, di-, or tri-substituted phenol compound which provides the high rate of removal of titanium and other metals in the composites may also be compounds which suppress the rate of removal of silica as defined in U.S. Pat. No. 5,391,258 and U. S. Pat. No. 5,476,606. Examples of such compounds are salicylic acid and substituted salicylic acid such as 5-sulfo salicylic acid.

The pH of the compositions of this invention may be adjusted by the addition of an acid or a base to the composition. Generally compositions used for CMP of titanium and other metals have a pH in the range of about 1 to about 7. If a compound to suppress the rate of removal of silica is being used, which will have at least two dissociable acid groups, the pH of the polishing composition may be adjusted so that the pKa of the first dissociable acid is maintained to be not substantially larger than the pH of the polishing composition.

EXAMPLE 1

8 inch wafers with a surface of 8000 Angstroms tungsten/ 400 Angstroms $Ti_3N_4$/250 Angstroms Ti were polished on a Westech 372U polishing machine under the following conditions: pressure 7psi, carrier 50rpm, table 40rpm, back pressure 3psi using an IC1000-P/Suba TM IV pad (available from Rodel, Inc., Newark, Del.). The control slurry no.1 comprised about 3% potassium iodate, about 3% ammonium hydrogen phthalate, about 5% submicron alumina, the remainder being deionized water. The pH of slurry no.1 is about 4. Slurry no.2 is comprised of about 2% potassium iodate, about 1 % salicylic acid, and about 5% submicron alumina. The pH of slurry no.2 and the following slurries no.3, 4 and 5 is about 3.5. pH adjustment is made by the addition of an acid (nitric acid) or a base (ammonium hydroxide) as required. Slurry no.3 was the same as slurry no.2 with the addition of about 3% hydrogen peroxide added as a 30% solution of hydrogen peroxide in water. Table 1 shows resulting clear times for all three layers, for the tungsten layer, and for the two layers containing titanium.

TABLE 1

| Slurry | Clear Time (seconds) | | |
|---|---|---|---|
| | Total | Tungsten | $Ti/Ti_3N_4$ |
| No. 1 | 210 | 124 | 86 |
| No. 2 | 190 | 123 | 67 |
| No. 3 | 135 | 90 | 45 |
| No. 1 | 187 | 105 | 82 |

EXAMPLE 2

In this Example, the same wafers, polishing conditions, and control slurry No.1 are used as described in Example 1. A salicylic acid derivative, 5-sulfo salicylic acid, is used in place of salicylic acid in slurries No.4 and No.5. Clear time results are given in Table 2 below:

TABLE 2

| Slurry | Clear Time (seconds) | | |
|---|---|---|---|
| | Total | Tungsten | $Ti/Ti_3N_4$ |
| No. 1 | 210 | 124 | 86 |
| No. 4 | 180 | 120 | 60 |

TABLE 2-continued

| Slurry | Clear Time (seconds) | | |
|---|---|---|---|
| | Total | Tungsten | $Ti/Ti_3N_4$ |
| No. 5 | 118 | 82 | 36 |
| No. 1 | 187 | 105 | 82 |

EXAMPLE 3

In this example 8 inch wafers with a surface of 10000 Angstroms aluminum/500 Angstroms TiN/350 Angstroms Ti were polished as in Examples 1 and 2. The slurries used (No.1 and No.4) are the same as those described in Example 2. Clear time results are given in Table 3 below:

TABLE 3

| Slurry | Clear Time (seconds) | | |
|---|---|---|---|
| | Total | Tungsten | $Ti/Ti_3N_4$ |
| No. 1 | 250 | 170 | 80 |
| No. 4 | 170 | 115 | 55 |

It is obvious from the above Examples that a mono-, di-, or tri-substituted phenol wherein at least one of the substituted functional groups is polar, such as salicylic acid and it's derivatives, enhances the rate of removal of titanium and titanium nitride and can be effective in polishing a composite which contains another metal, such as tungsten, aluminum, or copper.

Nothing from the above discussion is meant to be restrictive in any way with respect to the present invention. All limitations to the scope of the present invention are found in the claims, as provided below.

We claim:

1. A composition, which is an aqueous slurry useful for the chemical-mechanical polishing of substrates which comprise titanium, comprising: water, submicron abrasive particles, an oxidizing agent, and a mono-, di-, or tri-substituted phenol wherein at least one of the substituted functional groups is polar.

2. A composition according to claim 1 wherein said submicron abrasive particles are alumina.

3. A composition according to claim 1 wherein said oxidizing agent comprises potassium iodate.

4. A composition according to claim 3 wherein said oxidizing agent further comprises hydrogen peroxide.

5. A composition according to claim 1 further comprising a compound or compounds which suppress the rate of removal of silica.

6. A composition according to claim 4 further comprising a compound or compounds which suppress the rate of removal of silica.

7. A composition according to claim 2 further comprising a compound or compounds which suppress the rate of removal of silica.

8. A composition according to claim 3 further comprising a compound or compounds which suppress the rate of removal of silica.

9. A composition according to claim 1 wherein said mono-, di-, or tri-substituted phenol is salicylic acid or a substuted salicylic acid.

10. A method of polishing a substrate comprising titanium wherein said substrate is pressed against a polishing pad, said substrate and said pad are moved relative to each other, and a polishing composition is applied to said pad during the polishing operation, said polishing composition comprising: water, submicron abrasive particles, an oxidizing agent, and a mono-, di-, or tri-substituted phenol wherein at least one of the substituted functional groups is polar.

11. A method according to claim 10 wherein said submicron abrasive particles are alumina.

12. A method according to claim 10 wherein said oxidizing agent comprises potassium iodate.

13. A method according to claim 12 wherein said oxidizing agent further comprises hydrogen peroxide.

14. A method according to claim 10 wherein said composition further comprises a compound which suppresses the rate of removal of silica.

15. A method according to claim 10 wherein said substrate also comprises tungsten.

16. A method according to claim 10 wherein said substrate also comprises aluminum.

17. A method according to claim 10 wherein said substrate also comprises copper.

* * * * *